United States Patent
Dibiaso et al.

(10) Patent No.: US 7,697,886 B2
(45) Date of Patent: Apr. 13, 2010

(54) METHOD AND SYSTEM TO INCREASE AVAILABLE BANDWIDTH IN A TIME DIVISION MULTIPLEXING SYSTEM

(75) Inventors: Eric A. Dibiaso, Kokomo, IN (US); Glenn A. Walker, Greentown, IN (US); Timothy D. Bolduc, Westfield, IN (US)

(73) Assignee: Delphi Technologies, Inc., Troy, MI (US)

( * ) Notice: Subject to any disclaimer, the term of this patent is extended or adjusted under 35 U.S.C. 154(b) by 936 days.

(21) Appl. No.: 11/132,581

(22) Filed: May 19, 2005

(65) Prior Publication Data
US 2006/0276125 A1 Dec. 7, 2006

(51) Int. Cl.
*H04Q 7/20* (2006.01)
*H04B 7/185* (2006.01)
*H04K 3/00* (2006.01)

(52) U.S. Cl. .............. 455/3.01; 455/12.1; 455/13.1; 455/427

(58) Field of Classification Search ........... 455/3.01, 455/3.02, 3.05, 3.06, 12.1, 13.1, 427, 428, 455/429, 431; 370/311, 318, 320
See application file for complete search history.

(56) References Cited

U.S. PATENT DOCUMENTS

| | | | | |
|---|---|---|---|---|
| 5,305,322 A | * | 4/1994 | Kabaya et al. | 370/505 |
| 5,991,279 A | * | 11/1999 | Haugli et al. | 370/311 |
| 6,154,452 A | * | 11/2000 | Marko et al. | 370/321 |
| 6,230,097 B1 | * | 5/2001 | Dance et al. | 701/207 |
| 6,314,269 B1 | * | 11/2001 | Hart et al. | 455/12.1 |
| 6,320,850 B1 | | 11/2001 | Perahia et al. | |
| 6,347,216 B1 | * | 2/2002 | Marko et al. | 455/12.1 |
| 6,385,532 B1 | * | 5/2002 | Dance et al. | 701/207 |

(Continued)

FOREIGN PATENT DOCUMENTS

EP 0676875 10/1995

(Continued)

OTHER PUBLICATIONS

EP Search Report dated Sep. 26, 2006.

*Primary Examiner*—Tilahun Gesesse
(74) *Attorney, Agent, or Firm*—Jimmy L. Funke

(57) ABSTRACT

The present invention involves a method for transmitting data within a specified band of allocated spectrum in a satellite digital transmission system. First a data stream is encoded according to a first encoding scheme, then a second data stream is generated according to a second encoding scheme. The second encoding scheme is incompatible with the first encoding scheme. The first and second data streams are transmitted at predetermined locations within the specified band, such as time slices within a time division multiplexing transmission system. The second data stream is generated by using a more efficient FEC algorithm, including turbo-convolutional, turbo-product, low density parity check, or repeat-accumulate encoders. The inventive receiver has an antenna for receiving RF signals and a demodulator coupled to the antenna for downconverting received RF signals into a data stream. A splitter then separates the data stream into first and second component data streams. A first detector is coupled to the splitter, and is adapted to detect data in the first format. A second detector is coupled to the splitter, and is adapted to detect data in the second format.

24 Claims, 3 Drawing Sheets

U.S. PATENT DOCUMENTS

| | | | |
|---|---|---|---|
| 6,549,774 B1 * | 4/2003 | Titlebaum et al. | 455/427 |
| 6,549,846 B1 * | 4/2003 | Dance et al. | 701/207 |
| 6,570,858 B1 * | 5/2003 | Emmons et al. | 370/321 |
| 7,123,875 B1 * | 10/2006 | Marko et al. | 455/3.02 |
| 7,215,713 B2 * | 5/2007 | Walker et al. | 370/328 |
| 7,230,998 B2 * | 6/2007 | Walker et al. | 375/308 |
| 7,274,653 B1 * | 9/2007 | Settle et al. | 370/206 |
| 7,274,905 B1 * | 9/2007 | Nguyen et al. | 455/3.02 |
| 7,274,906 B1 * | 9/2007 | Nguyen et al. | 455/3.05 |
| 7,280,613 B2 * | 10/2007 | Walker et al. | 375/308 |
| 7,398,050 B2 * | 7/2008 | Walker | 455/3.02 |
| 7,480,351 B2 * | 1/2009 | Hiatt et al. | 375/332 |
| 7,499,696 B2 * | 3/2009 | Dibiaso et al. | 455/403 |
| 2003/0009765 A1 * | 1/2003 | Linden et al. | 455/3.01 |
| 2003/0137964 A1 | 7/2003 | Suenaga et al. | |
| 2005/0141627 A1 * | 6/2005 | Walker et al. | 375/260 |
| 2005/0143004 A1 * | 6/2005 | Dibiaso et al. | 455/12.1 |
| 2005/0277382 A1 * | 12/2005 | Walker | 455/3.02 |
| 2006/0264191 A1 * | 11/2006 | Lai | 455/127.2 |
| 2006/0281401 A1 * | 12/2006 | DiBiaso et al. | 455/3.02 |

FOREIGN PATENT DOCUMENTS

| | | |
|---|---|---|
| EP | 0732832 | 9/1996 |
| EP | 1115218 | 7/2001 |
| EP | 1536574 | 6/2005 |

* cited by examiner

US 7,697,886 B2

METHOD AND SYSTEM TO INCREASE AVAILABLE BANDWIDTH IN A TIME DIVISION MULTIPLEXING SYSTEM

TECHNICAL BACKGROUND

The present invention generally relates to the transmission of digital data, and more particularly, to the transmission of digital data in a satellite digital audio radio ("SDAR") system.

BACKGROUND OF THE INVENTION

In October of 1997, the Federal Communications Commission (FCC) granted two national satellite radio broadcast licenses. In doing so, the FCC allocated twenty-five (25) megahertz (MHz) of the electromagnetic spectrum for satellite digital broadcasting, twelve and one-half (12.5) MHz of which are owned by XM Satellite Radio, Inc. of Washington, D.C. (XM), and 12.5 MHz of which are owned by Sirius Satellite Radio, Inc. of New York City, N.Y. (Sirius). Both companies provide subscription-based digital audio that is transmitted from communication satellites, and the services provided by these and other SDAR companies are capable of being transmitted to both mobile and fixed receivers on the ground.

In the XM satellite system, two (2) communication satellites are present in a geostationary orbit—one satellite is positioned at longitude 115 degrees (west) and the other at longitude eighty-five (85) degrees (east). Accordingly, the satellites are always positioned above the same spot on the earth. In the Sirius satellite system, however, three (3) communication satellites are present that all travel on the same orbital path, spaced approximately eight (8) hours from each other. Consequently, two (2) of the three (3) satellites are "visible" to receivers in the United States at all times. Since both satellite systems have difficulty providing data to mobile receivers in urban canyons and other high population density areas with limited line-of-sight satellite coverage, both systems utilize terrestrial repeaters as gap fillers to receive and re-broadcast the same data that is transmitted in the respective satellite systems.

In order to improve satellite coverage reliability and performance, SDAR systems currently use three (3) techniques that represent different kinds of redundancy known as diversity. The techniques include spatial diversity, time diversity and frequency diversity. Spatial diversity refers to the use of two (2) satellites transmitting near-identical data from two (2) widely-spaced locations. Time diversity is implemented by introducing a time delay between otherwise identical data, and frequency diversity includes the transmission of data in different frequency bands. SDAR systems may utilize one (1), two (2) or all of the techniques.

The XM satellite system uses a time division multiplexing (TDM) type system using quadrature phase shift keying (QPSK) modulation with overhead from forward-error-correction coding (Reed-Solomon outer code and convolutional inner code) and encryption. The XM scheme is enhanced by Advanced Audio Coding (AAC) that is further enhanced by Spectrum Band Replication (SBR) technology.

The Sirius satellite system uses a TDM system using quadrature phase shift keying (QPSK) nodulation similar to the base of the XM system. However, unlike XM, the Sirius scheme is enhanced with Perceptual Audio Codecs (PACs) and statistical multiplexing.

The limited allocation of twenty-five (25) megahertz (MHz) of the electromagnetic spectrum for satellite digital broadcasting has created a need in the art for an apparatus and method for increasing the amount of data that may be transmitted from the communication satellites to the receivers in SDAR systems.

SUMMARY OF THE INVENTION

The present invention provides an apparatus and method for increasing the amount of digital data that may be transmitted from communication satellites to receivers in SDAR systems. The invention involves segmenting the time slot allocation of an SDAR system by having portions with different coding schemes so that a portion of the transmission may use coding schemes providing greater data capacity. This allows legacy receivers to continue to receive time slots using the old coding, while second generation receivers may receive both the legacy coded data and the new coded data, which utilizes the remaining time slots.

In one embodiment, newly coded FEC transmissions and receiving methods are used for a portion of the SDAR TDM frames so that legacy receivers are incapable of receiving the newly coded time slots.

BRIEF DESCRIPTION OF THE DRAWINGS

The above-mentioned and other features and objects of this invention, and the manner of attaining them, will become more apparent and the invention itself will be better understood by reference to the following description of embodiments of the invention taken in conjunction with the accompanying drawings, wherein.

Figure 1:
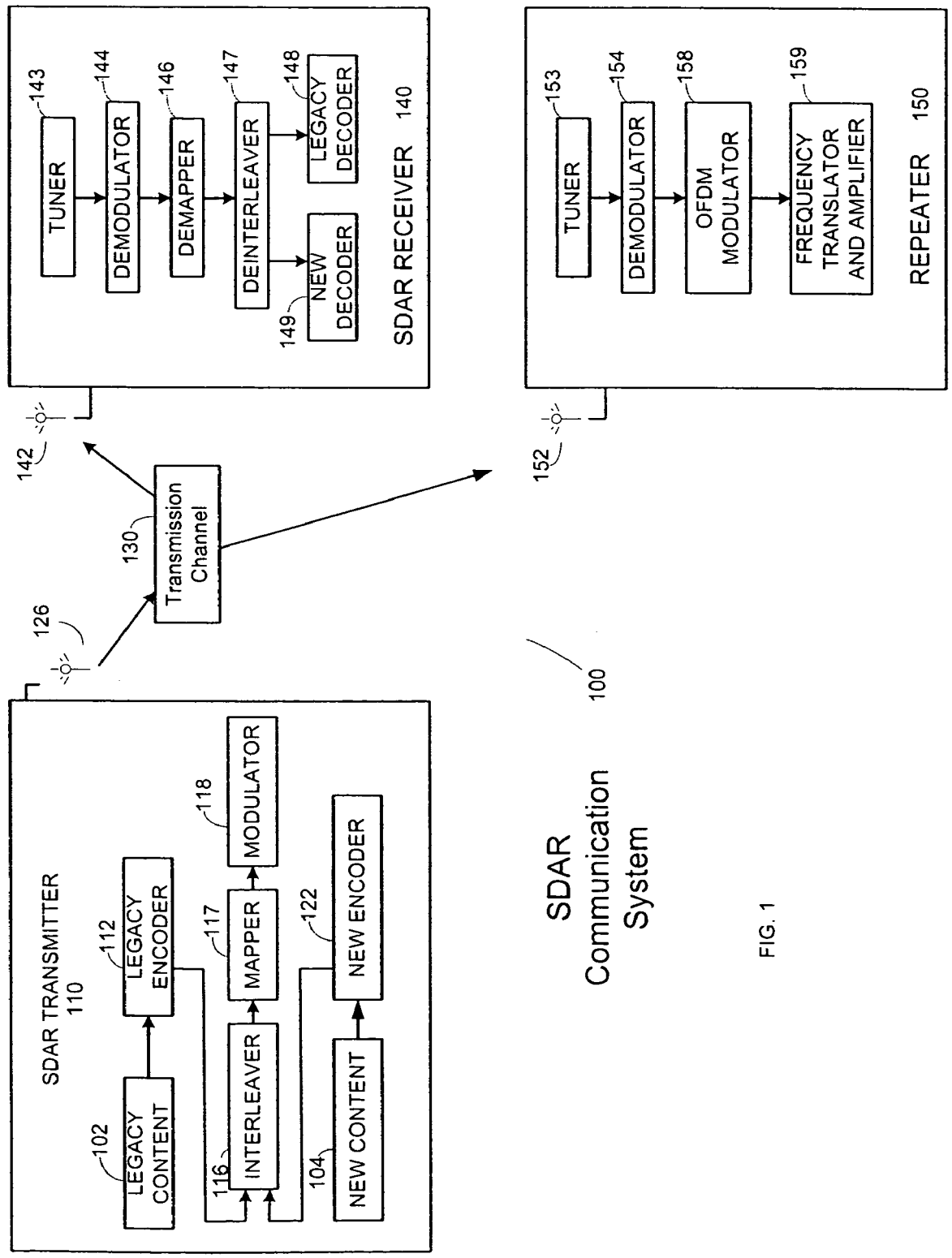
FIG. 1 is a diagrammatic view of a SDAR system implementing a method of the present invention.

Corresponding reference characters indicate corresponding parts throughout the several views. Although the drawings represent embodiments of the present invention, the drawings are not necessarily to scale and certain features may be exaggerated in order to better illustrate and explain the present invention. The exemplifications set out herein illustrate embodiments of the invention in several forms and such exemplification is not to be construed as limiting the scope of the invention in any manner.

DESCRIPTION OF INVENTION

The embodiments disclosed below are not intended to be exhaustive or limit the invention to the precise forms disclosed in the following detailed description. Rather, the embodiments are chosen and described so that others skilled in the art may utilize their teachings.

For the purposes of the present invention, certain terms shall be interpreted in accordance with the following definitions.

Baseband: A signal whose frequency content is in the vicinity of direct current (DC).

Carrier: A single frequency electromagnetic wave the modulations of which are used as communications signals.

Channel: A propagation medium for communication such as a path along which information in the form of an electrical signal passes (e.g., wire, air, water).

Data rate: The amount of data, or number of symbols, which may be transmitted on a signal per a unit of time.

Detector: A circuit that is capable of determining the content of a signal.

Downconvert: To convert a radio frequency signal from a higher to a lower frequency signal for processing (i.e., to baseband).

Downlink: To transmit data from a satellite to a receiver on earth.

Forward Error Correction (FEC): A method of obtaining error control in data transmission in which the source (transmitter) sends redundant data and the destination (receiver) recognizes only the portion of the data that contains no apparent errors. Because FEC does not require handshaking between the source and the destination, it can be used for broadcasting of data to many destinations simultaneously from a single source.

Legacy receiver: A current or existing SDAR receiver that is capable of interpreting legacy coded data. Legacy receivers will not have the capability of decoding the new coded data.

Quadrature: A method of coding information that groups data bits and transmits two separate signals on a carrier by summing the cosine and sine of the separate signals to produce a composite signal which may be later demodulated to recover both signals.

Second Generation Receiver: A SDAR receiver that contains hardware and/or software enabling the receiver to interpret the new coded data (e.g., decoder enhancements). Second generation receivers may also interpret the legacy coded data.

Signal: A detectable physical quantity or impulse by which information can be transmitted.

Symbol: A unit of data (byte, floating point number, spoken word, etc.) that is treated independently.

Unitary Signal: A signal on a single channel or path.

Upconvert: To convert from a lower frequency signal (i.e., baseband) to a higher radio frequency signal for broadcasting.

Uplink: A communications channel or facility on earth for transmission to a satellite, or the communications themselves.

Upmix: To combine multiple electrical signals to a radio frequency signal for broadcasting.

Waveform: A representation of the shape of a wave that indicates its characteristics (frequency and amplitude).

FIG. 1 illustrates a block diagram of a SDAR communication system in which two different data streams are utilized, in this example one of the data streams utilizes the aforementioned new coded data. In an exemplary embodiment of the present invention, SDAR communication system 100 includes SDAR transmitter 110, SDAR receiver 140 and terrestrial repeater 150. As in conventional SDAR communication systems, SDAR communication system 100 will input legacy data content 102 and perform processing and frequency translation within transmitter 110, along with the new content 104. The digital data is transmitted over transmission channel 130 to receiver 140 or terrestrial repeater 150. Generally, receiver 140 performs the converse operations of transmitter 110 to recover original content 102 and 104. Repeater 150 generally re-transmits data 102 and 104 to receiver 140. Unlike conventional SDAR communication systems, however, transmitter 110, receiver 140 and repeater 150 of the present invention provide hardware enabling SDAR communication system 100 to utilize new FEC technologies to transmit and receive additional digital data in combination with conventional SDAR channel systems.

SDAR transmitter 110 includes encoders 112 and 122. The audio, video, or other form of digital content to be transmitted comprises legacy content, data stream, or input signal, 102 and new content, data stream, or input signal, 104, which are typically arranged as a series of k-bit symbols. Legacy input signal 102 contains data recognizable by a legacy receiver or second generation receiver, and new input signal 104 contains data only recognizable by a second generation receiver. Thus, legacy input signal 102 includes the signals destined for the legacy channels.

Encoders 112 and 122 encode the k bits of each symbol as well as blocks of the k-bit symbols. In other embodiments of the present invention, separate encoders may be used to encode the blocks of k-bit symbols, for example, outer and inner encoders. In an exemplary embodiment of the present invention, legacy encoder 112 may encode legacy data stream 102 using a block or a convolutional forward error correction (FEC) algorithm, and new encoder 122 may encode new data stream 104 using a turbo coding algorithm (i.e., turbo-convolutional, turbo-product) or a low density parity check FEC algorithm and/or repeat-accumulate. It is contemplated that other FEC encoding methods may be utilized to encode legacy and new data streams 102, 104, including, for example, Hamming codes, cyclic codes and Reed-Solomon (RS) codes.

Again referring to FIG. 1, inner interleaver 116 multiplexes encoded new content data stream 104 with encoded legacy content data stream 102 to form one transmit data stream. This transmit data stream is passed to mapper 117, which maps the data stream into symbols composed of I and Q signals. Mapper 117 may be implemented as a look-up table where sets of bits from the transmit signal are translated into I and Q components representing constellation points or symbols. The resulting data stream is uplinked by modulator 118 to transmit the combined legacy and new content in the transmit data stream via antenna 126 over transmission channel 130 (the spectrum allocated for SDAR system 100) using one of a number of modulation techniques, including amplitude or phase and may include differential (e.g., BPSK, QPSK, differential Q-PSK, or pi/4 differential QPSK) or coherent modulation. According to the technique that modulator 118 employs, modulator 118 may use an amplitude or phase modulation technique.

Terrestrial repeater 150 includes terrestrial receiving antenna 152, tuner 153, demodulator 154, OFDM modulator 158, and frequency translator and amplifier 159. Demodulator 154 is capable of down-converting the transmit data stream, and OFDM modulator 158 re-encodes the bit-stream in an orthogonal frequency division multiplexing (OFDM) format for terrestrial transmission. OFDM modulation divides the bit stream between a large number of adjacent subcarriers, each of which is modulated with a portion of the bit stream using one of the M-PSK, differential M-PSK (D-MPSK) or differential pi/4 M-PSK (pi/4 D-MPSK) modulation techniques.

Figure 2:
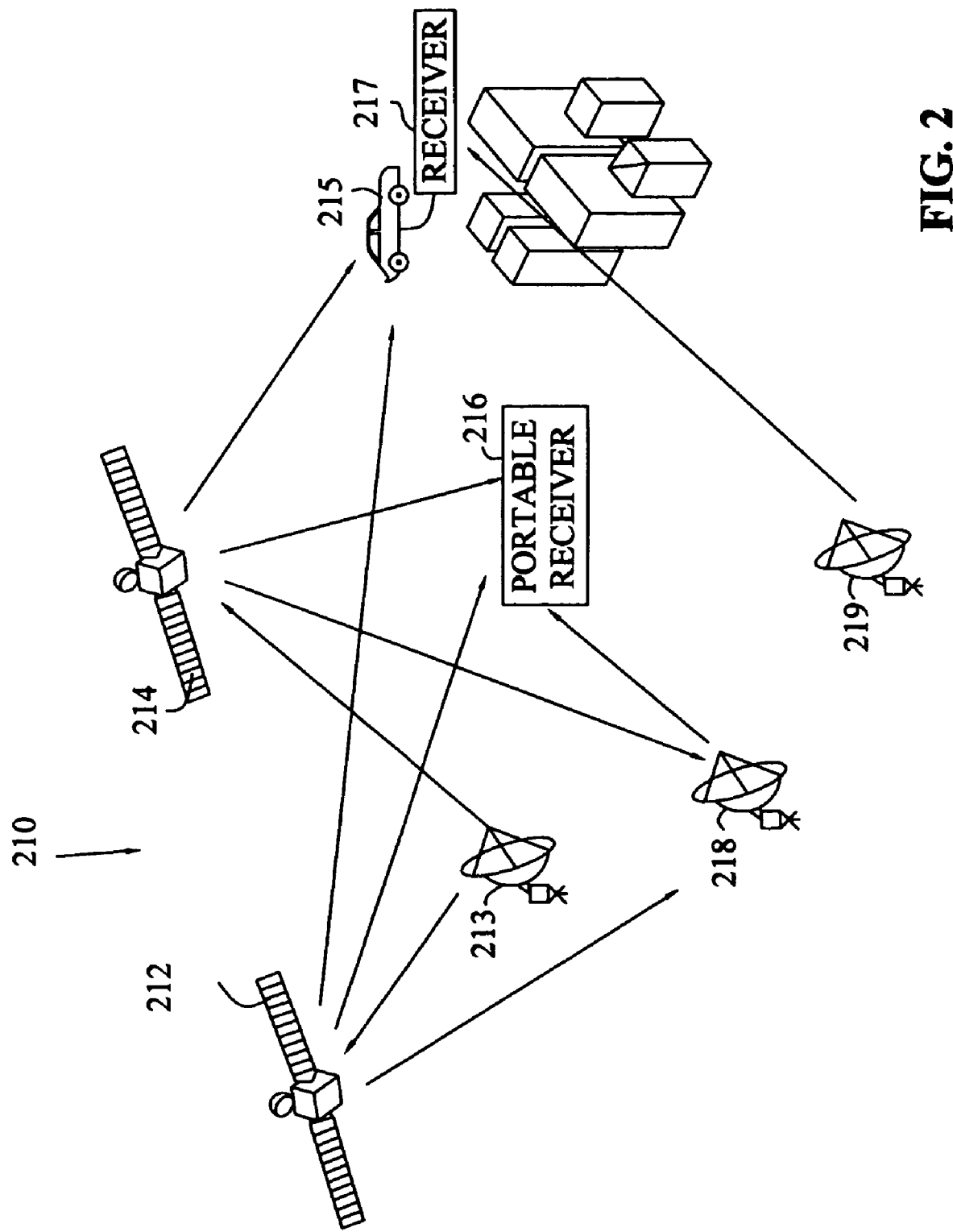
FIG. 2 is a block diagram of a SDAR communication system adapted to enable a method of the present invention.

Also shown in FIG. 1, SDAR receiver 140 contains hardware (e.g., a chipset) and/or software to process any received modulated signals as well. Receiver 140 includes one or more antennas 142 for receiving signals transmitted from either communication satellites 212, 214, terrestrial repeaters 218, 219, or both (FIG. 2). Receiver 140 also includes tuner 143 to translate the received signals to baseband. Separate tuners may be used to downmix the signals received from communication satellites 212, 214 and the signals received from terrestrial repeaters 218, 219. It is also envisioned that one tuner may be used to downmix both the signals transmitted from communication satellites 212, 214 and the signals transmitted from repeaters 218, 219.

Once the received signals are translated to baseband, the signals are demodulated by demodulator 144 to produce the I and Q components. Demapper 146 and deinterleaver 147 then sends the data stream to either new decoder 149 or legacy decoder 148. These encoded bit streams, which were interleaved by interleaver 116, are recovered by de-interleaver 147 and passed to decoders 148 and 149. Legacy encoder 148 employs known bit and block decoding methods to decode the received bit stream to produce the original input signals containing the legacy data 102, while new decoder 149 does the same for the new data. In other embodiments of the present invention, multiple decoders may be used, e.g., outer and inner decoders. Essentially decoders 148 and 149 will undo the effects of encoders 112 and 122 respectively.

The present invention contemplates the use of a new FEC algorithm for a portion of the transmitted data, e.g. for video services, in a SDAR system, while maintaining backward compatibility for legacy receivers. FIG. 2 is a diagrammatic view of a SDAR system in which the present invention is employed. SDAR system 210 includes first and second communication satellites 212, 214, which transmit line-of-sight signals to SDAR receivers 216, 217 located on the earth's surface. A third satellite may be included in other SDAR systems. Satellites 212, 214, as indicated above, may provide for spatial, frequency, and time diversity. As shown, receiver 216 is a portable receiver such as a handheld radio or wireless device. Receiver 217 is a mobile receiver for use in vehicle 215. SDAR receivers 216, 217 may also be stationary receivers for use in a home, office or other non-mobile environment.

SDAR system 210 further includes a plurality of terrestrial repeaters 218, 219. Terrestrial repeaters 218, 219 receive and retransmit the satellite signals to facilitate reliable reception in geographic areas where the satellite signals are obscured from the view of receivers 216, 217 by obstructions such as buildings, mountains, canyons, hills, tunnels, etc. The signals transmitted by satellites 212, 214 and terrestrial repeaters 218, 219 are received by receivers 216, 217, which either combine or select one of the signals as receiver's 216, 217 output.

In one embodiment of the invention, new data may be transmitted using different FEC coding and decoding than legacy data streams. This allows one portion of the bandwidth of a satellite transmission system to be devoted to legacy FEC coding schemes and allows a second portion to be devoted to new types of FEC or other coding schemes that may provide for enhanced service transmission. Legacy receivers still recognize the legacy portion of the transmission, while Second Generation receivers recognize both the legacy and new portions of the transmission. For example, twenty percent (20%) of the transmitted satellite data may be allocated to second generation transmissions to provide enhanced and/or additional services such as video, data, etc. to Second Generation receivers. In this example, the remaining eighty percent (80%) of the transmitted satellite data continues to use legacy transmissions to transmit digital audio radio signals. Legacy receivers would then detect only about eighty percent (80%) of the number of channels previously available on the satellite bandwidth, while Second Generation receivers would then detect both the legacy transmissions with corresponding digital audio radio signals, and the new data transmissions with the additional and/or enhanced signals. Such additional and/or enhanced signals may simply represent additional channels or may further represent enhanced audio data, video data, or other type of data service. This allows the introduction of enhanced or additional digital satellite offerings without making Legacy receivers obsolete.

Figure 3:
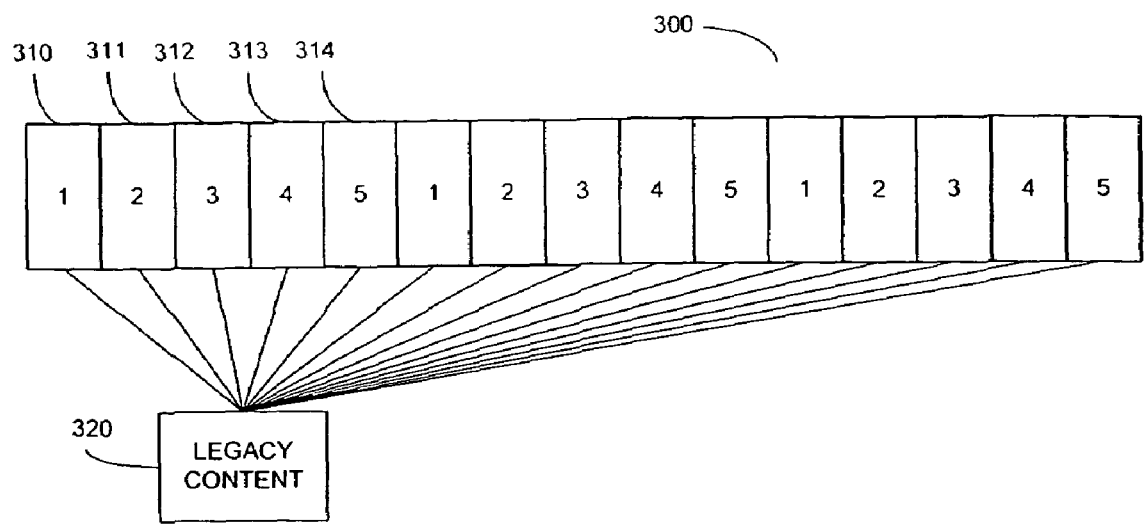
FIG. 3 is a schematic diagram showing time slot allocation in a conventional SDAR communication system.
Figure 4:
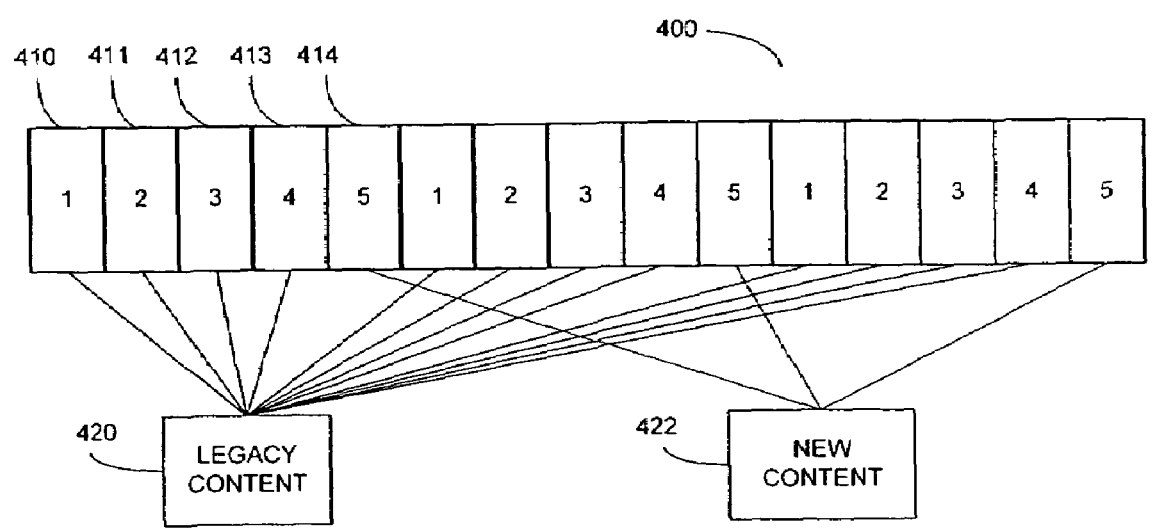
FIG. 4 is a schematic diagram showing time slot allocation in an SDAR communication system according to the present invention.

An example of time slot allocation is depicted in FIGS. 3 and 4 for conventional SDAR systems and those operating according to the present invention, respectively. In FIG. 3, the conventional organization of transmission system 300 includes a series of time slices 310, 311, 312, 313, and 314 in which legacy content 320 is transmitted. Simplifying the TDM scheme, FIGS. 3 and 4 show five time slices in each frame of TDM transmission. FIG. 4 represents transmission system 400 including legacy time slices 410, 411, 412, and 413 where the broadcast is encoded in the conventional, legacy fashion with legacy content 420, and enhanced time slice 414 having signals encoded with enhanced data as described above representing new content 422. As stated in the above examples, legacy receivers detect the signals in legacy time slices 410, 411, 412, and 413, but lack the enhanced decoding to recognize the data in enhanced time slice 414.

The present invention thus may increase the amount of data which may be included in transmissions for second generation receivers. The amount of additional data which may be included depends on the code rate and performance of the new FEC's, as well as the required performance level of the new data. With conventional existing FEC's, the inventors estimate 25% additional data may be provided through each the new time slot. In addition, with advances in FEC's currently under development, the amount of improvement may go as high as 40%. As further FEC's are developed in the future, even greater data may be transmitted within the new content time slots.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

We claim:

1. A method for transmitting data within a specified band in a satellite digital transmission system comprising the steps of:
    generating a first data stream according to a legacy encoding scheme;
    generating a second data stream according to a new encoding scheme, the new encoding scheme being incompatible with the legacy encoding scheme; and
    transmitting the first data stream and the second data stream at predetermined locations using a time division multiplex (TDM) structure in single carrier or multi-carrier modulation, such that a predetermined portion of the transmission that was previously allocated for the legacy encoding scheme is allocated for the new encoding scheme, for increasing the total amount of data content transmitted in the system.

2. The method of claim 1 wherein the second data stream generating step includes using a forward error correction (FEC) encoder which is more efficient than the encoder used in the first data stream generating step.

3. The method of claim 2 wherein the second data stream generating step includes using one of a turbo-convolutional, turbo-product, low density parity check, and repeat-accumulate FEC encoders.

4. The method of claim 1 wherein the transmitting step includes allocating the first data stream time slices of a time division multiplexing transmission to a portion of the specified band.

5. The method of claim 4 wherein the transmitting step includes allocating the second data stream time slices of a time division multiplexing transmission that are not allocated to the first data stream.

6. The method of claim 1 further including the step of interleaving the first and second data streams.

7. The method of claim 6 further including the step of receiving the transmitted first and second data streams.

8. The method of claim 7 wherein the receiving step includes de-interleaving the first and second data streams.

9. The method of claim 7 further including the steps of demodulating the first and second data streams, performing orthogonal frequency division multiplexing (OFDM) modulation, and transmitting an OFDM signal including the first and second data streams.

10. A receiver for receiving data within a time division multiplex (TDM) structure in a satellite digital transmission system, the data being transmitted having first and second encoding formats that are operationally incompatible comprising:
   an antenna for receiving radio frequency (RF) signals;
   a demodulator coupled to said antenna for downconverting received RF signals into a data stream where a predetermined portion of the data stream that was previously allocated for a first format includes data allocated in a second format for increasing the total amount of data content transmitted in the system;
   a splitter for separating the data stream into the first and second component TDM data streams;
   a first detector coupled to said splitter, said first detector having a first output, and said first detector being adapted to detect data in the first format and provide data on said first output;
   a second detector coupled to said splitter, said second detector having a second output, and said second detector being adapted to detect data in the second format and provide data on said second output; and
   wherein the second component TDM data stream has less forward error correction (FEC) than the first data stream for enabling the receipt of additional data content.

11. The receiver of claim 10 wherein said antenna is adapted to receive satellite broadcast signals.

12. The receiver of claim 10 wherein said second detector is configured to perform a forward error correction (FEC) decoding algorithm which is more efficient than the decoding algorithm used in the first detector.

13. The receiver of claim 10 wherein said second detector is configured to perform one of a turbo-convolutional, turbo-product, low density parity check, and repeat-accumulate forward error correction (FEC) decoding algorithm.

14. The receiver of claim 10 wherein said demodulator is adapted to demodulate time division multiplexing transmissions.

15. The receiver of claim 10 wherein said splitter includes a de-interleaver.

16. The receiver of claim 10 wherein said splitter includes a de-mapper.

17. The receiver of claim 10 wherein said demodulator is capable of demodulating an orthogonal frequency division multiplexing (OFDM) signal.

18. The receiver of claim 17 further comprising a second antenna adapted to receive OFDM signals.

19. A transmitter for transmitting satellite digital audio radio signals comprising:
   a legacy encoder configured to encode a first data stream;
   a new encoder configured to encode a second data stream, the new encoder being incompatible with the legacy encoder;
   a modulator coupled to said legacy and new encoders, said modulator configured to transmit the first data stream and the second data stream at predetermined locations using a time division multiplex (TDM) structure in single carrier or multi-carrier modulation;
   a transmitter coupled to said modulator configured to transmit said modulated output; and
   wherein a predetermined portion of the first data stream that was previously allocated for the first data stream is allocated for the second data stream for increasing the total amount of data content transmitted in the digital audio radio signal.

20. The transmitter of claim 19 wherein said second encoder includes an FEC encoder which is more efficient than said first forward error correction (FEC) encoder.

21. The transmitter of claim 19 wherein said second encoder includes one of a turbo-convolutional, turbo-product, low density parity check, and repeat-accumulate forward error correction (FEC) encoders.

22. The transmitter of claim 19 wherein said modulator includes a mapper.

23. The transmitter of claim 22 wherein said modulator further includes an interleaver.

24. The transmitter of claim 19 wherein said modulator performs orthogonal frequency division multiplexing (OFDM) modulation, for transmitting an OFDM signal including the first and second data streams.

* * * * *